US012696775B2

(12) United States Patent
Shin et al.

(10) Patent No.: US 12,696,775 B2
(45) Date of Patent: Jul. 28, 2026

(54) SEMICONDUCTOR PACKAGE

(71) Applicant: Samsung Electronics Co., Ltd., Suwon-si (KR)

(72) Inventors: Seongho Shin, Suwon-si (KR); Jonghyeon Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 624 days.

(21) Appl. No.: 18/098,972

(22) Filed: Jan. 19, 2023

(65) Prior Publication Data

US 2023/0387026 A1 Nov. 30, 2023

(30) Foreign Application Priority Data

May 26, 2022 (KR) ........................ 10-2022-0064739

(51) Int. Cl.
| | |
|---|---|
| *H01L 23/538* | (2006.01) |
| *H05K 1/11* | (2006.01) |
| *H10W 20/20* | (2026.01) |
| *H10W 70/60* | (2026.01) |
| *H10W 70/63* | (2026.01) |
| *H10W 70/685* | (2026.01) |
| *H10W 90/00* | (2026.01) |

(Continued)

(52) U.S. Cl.
CPC .......... *H10W 70/611* (2026.01); *H05K 1/116* (2013.01); *H10W 20/20* (2026.01); *H10W 70/635* (2026.01); *H10W 70/685* (2026.01); *H10W 90/00* (2026.01); *H10W 90/701*

(2026.01); *H05K 2201/10234* (2013.01); *H05K 2201/2081* (2013.01); *H10W 74/15* (2026.01); *H10W 90/297* (2026.01); *H10W 90/722* (2026.01); *H10W 90/724* (2026.01); *H10W 90/734* (2026.01)

(58) Field of Classification Search
None
See application file for complete search history.

(56) References Cited

U.S. PATENT DOCUMENTS

| | | | | |
|---|---|---|---|---|
| 6,894,381 | B2 * | 5/2005 | Hetzel | H01L 23/3114 438/109 |
| 8,097,940 | B2 * | 1/2012 | Baek | H01L 23/13 257/777 |

(Continued)

FOREIGN PATENT DOCUMENTS

| | | |
|---|---|---|
| KR | 20140128536 A | 11/2014 |
| KR | 20170097831 A | 8/2017 |

(Continued)

*Primary Examiner* — Long Pham
(74) *Attorney, Agent, or Firm* — Muir Patent Law, PLLC

(57) ABSTRACT

Disclosed is a semiconductor package comprising a solder ball, a printed circuit board on the solder ball, a bump on the printed circuit board, and a semiconductor chip on the bump. The printed circuit board includes a base substrate, a low-k dielectric layer that penetrates the base substrate, a connection conductive structure electrically connected to the bump and surrounded by the low-k dielectric layer, and a lower conductive structure electrically connected to the solder ball and the connection conductive structure. A top surface of the lower conductive structure is in contact with a first bottom surface of the low-k dielectric layer.

19 Claims, 6 Drawing Sheets

(51) Int. Cl.
    *H10W 74/15*           (2026.01)
    *H10W 90/20*           (2026.01)

(56)             References Cited

U.S. PATENT DOCUMENTS

| | | | |
|---|---|---|---|
| 8,378,478 B2 * | 2/2013 | Desai | H01L 24/19 |
| | | | 438/106 |
| 8,513,802 B2 | 8/2013 | Ma et al. | |
| 8,637,992 B2 | 1/2014 | Sakuma et al. | |
| 8,759,982 B2 * | 6/2014 | Crisp | G11C 5/06 |
| | | | 257/723 |
| 8,981,549 B2 * | 3/2015 | Kim | H01L 23/13 |
| | | | 257/690 |
| 12,355,001 B2 * | 7/2025 | Tu | H01L 24/17 |
| 2002/0171142 A1 * | 11/2002 | Kinsman | H01L 21/563 |
| | | | 257/E21.511 |
| 2011/0042824 A1 * | 2/2011 | Koide | H01L 21/76898 |
| | | | 257/784 |

FOREIGN PATENT DOCUMENTS

| | | |
|---|---|---|
| KR | 20210110008 A | 9/2021 |
| KR | 20220030676 A | 3/2022 |

* cited by examiner

BP

200

MD

200

AD 204
203
202
201 } 200

BP

US
BS } PCB
LS

L1 W1

133
LS_T

100

LS_B 131 132 134 123 102 121 122 110

130 101 120

D3
D2 D1

MDa

ADa

200a

BPa

USa

BSa    PCBa

LSa

100a 131a  132a   121a  122a    141a  142a    110a 152a 130a        120a          140a    151a

D3

D1

D2

SEMICONDUCTOR PACKAGE

CROSS-REFERENCE TO RELATED APPLICATION

This U.S. nonprovisional application claims priority under 35 U.S.C § 119 to Korean Patent Application No. 10-2022-0064739 filed on May 26, 2022 in the Korean Intellectual Property Office, the disclosure of which is hereby incorporated by reference in its entirety.

BACKGROUND

Aspects of the present inventive concept relate to a semiconductor package, and more particularly, to a semiconductor package including a low-k dielectric layer.

In response to the rapid development of the electronic industry and user demands, electronic products have become smaller and increasingly multifunctional. There are also increased needs for miniaturization and multi-functionality of semiconductor devices used for electronic products. Thus, there has been suggested a semiconductor package in which a plurality of semiconductor chips having through vias (TSV) are stacked in a vertical direction.

SUMMARY

Some embodiments of the present inventive concepts provide a semiconductor package with increased reliability and improved electrical properties.

According to some embodiments of the present inventive concepts, a semiconductor package may comprise: a solder ball; a printed circuit board on the solder ball; a bump on the printed circuit board; and a semiconductor chip on the bump. The printed circuit board may include: a base substrate; a low-k dielectric layer that penetrates the base substrate; a connection conductive structure electrically connected to the bump and surrounded by the low-k dielectric layer; and a lower conductive structure electrically connected to the solder ball and the connection conductive structure. A top surface of the lower conductive structure may be in contact with a first bottom surface of the low-k dielectric layer.

According to some embodiments of the present inventive concepts, a semiconductor package may comprise: a solder ball; a printed circuit board on the solder ball; a bump on the printed circuit board; and a semiconductor chip on the bump. The printed circuit board may include: a low-k dielectric layer; a base substrate that surrounds the low-k dielectric layer; a connection conductive structure that is electrically connected to the bump and penetrates the low-k dielectric layer in a vertical direction; and a lower conductive structure electrically connected to the solder ball and the connection conductive structure.

According to some embodiments of the present inventive concepts, a semiconductor package may comprise: a solder ball; a printed circuit board on the solder ball; a bump on the printed circuit board; a semiconductor chip on the bump; and an adhesion layer between the semiconductor chip and the printed circuit board. The printed circuit board may include: a base substrate; an upper solder resist layer that covers a top surface of the base substrate; a lower solder resist layer that covers a bottom surface of the base substrate; a low-k dielectric layer that penetrates the base substrate; a connection conductive structure electrically connected to the bump and surrounded by the low-k dielectric layer; and a lower conductive structure electrically connected to the solder ball and the connection conductive structure. A top surface of the lower conductive structure may be in contact with a first bottom surface of the low-k dielectric layer and a bottom surface of the connection conductive structure. The lower solder resist layer may cover a second bottom surface of the low-k dielectric layer and a bottom surface of the lower conductive structure. The second bottom surface of the low-k dielectric layer may be at a level lower than a level of the first bottom surface of the low-k dielectric layer.

DETAILED DESCRIPTION OF EMBODIMENTS

The following will describe in detail a semiconductor package according to the present inventive concepts with reference to the accompanying drawings.

Figure 1A:
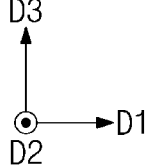
FIG. 1A illustrates a cross-sectional view showing a semiconductor package according to some embodiments.
Figure 1B:
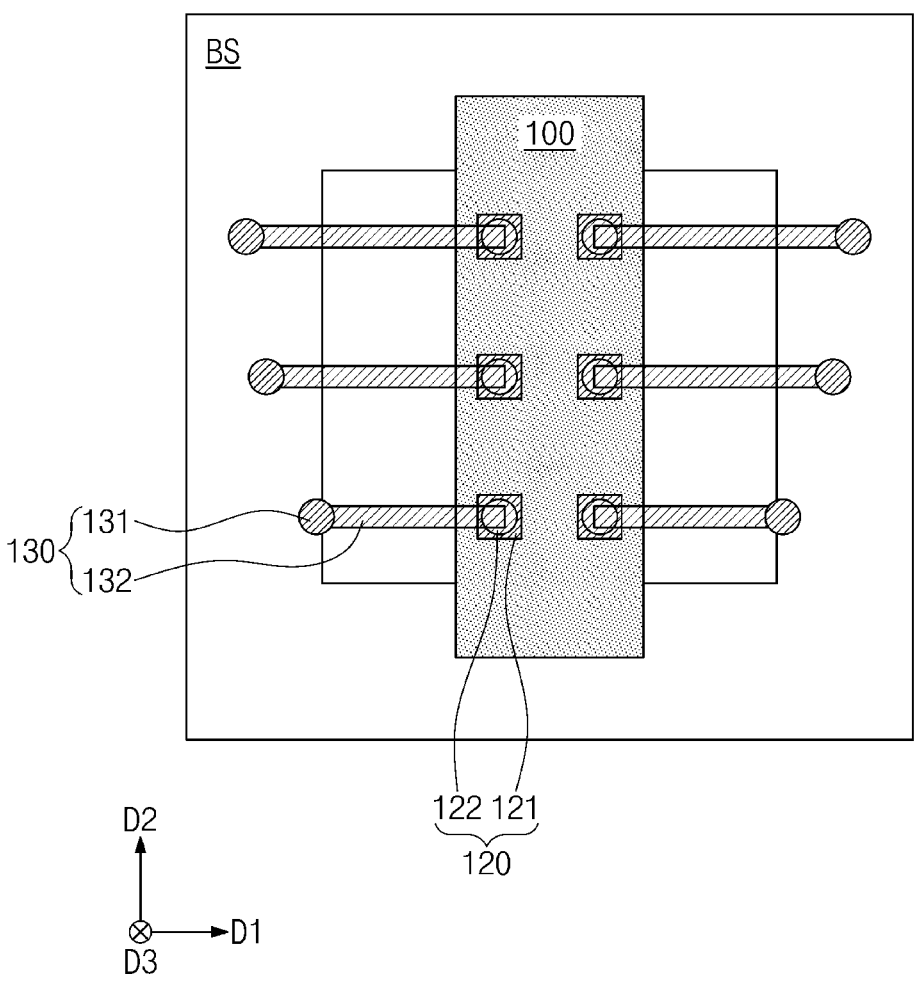
FIG. 1B illustrates a bottom view showing the semiconductor package of FIG. 1A.

FIG. 1A illustrates a cross-sectional view showing a semiconductor package according to some embodiments. FIG. 1B illustrates a bottom view showing the semiconductor package of FIG. 1A.

Referring to FIGS. 1A and 1B, a semiconductor package may include solder balls 110, a printed circuit board PCB on the solder balls 110, semiconductor chips 200 on the printed circuit board PCB, bumps BP on the printed circuit board PCB, adhesion layers AD on the printed circuit board PCB, and a molding layer MD that encapsulate the semiconductor chips 200.

The printed circuit board PCB may include a base substrate BS, a low-k dielectric layer 100, connection conductive structures 120, lower conductive structures 130, a lower solder resist layer LS, and an upper solder resist layer US.

The base substrate BS may have a plate shape that extends along a plane elongated in a first direction D1 and a second direction D2. The first direction D1 and the second direction D2 may intersect each other. For example, the first direction D1 and the second direction D2 may be horizontal directions that are orthogonal to each other. The base substrate BS may have a planar area (e.g., an area in a plan view) greater than that of a semiconductor chip 200. For example, the base substrate BS may integrally formed to have a single layer.

The base substrate BS may include or be formed of a polymeric material. For example, the base substrate BS may include or be formed of at least one selected from polyimide, bismaleimide, triazine, Teflon (or registered trademark for polytetrafluoroethylene (PTFE)), and epoxy. In some embodiments, the base substrate BS may further include inorganic fillers. For example, the inorganic fillers of the base substrate BS may be ceramic fillers or glass fillers. The base substrate BS may have a thickness, for example, of about 150 μm to about 250 ium.

The low-k dielectric layer 100 may penetrate in a third direction D3 through the base substrate BS. The third direction D3 may intersect the first direction D1 and the second direction D2. For example, the third direction D3 may be perpendicular to the first direction D1 and the second direction D2.

Spatially relative terms, such as "beneath," "below," "lower," "above," "upper," "vertical," "horizontal," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated degrees or at other orientations) and the spatially relative descriptors used herein interpreted accordingly.

The low-k dielectric layer 100 may be surrounded by the base substrate BS. For example, the base substrate BS may contact side surfaces of the low-k dielectric layer 100. In some embodiments, the low-k dielectric layer 100 may be provided in the base substrate BS. For example, the uppermost surface of the low-k dielectric layer 100 may be at the same level as or at a lower level than a top surface of the base substrate BS and the lowermost surface of the low-k dielectric layer 100 may be at the same level as or at a higher level than a bottom surface of the base substrate BS. The low-k dielectric layer 100 may have a first bottom surface 101 and a second bottom surface 102 located at a level lower than that of the first bottom surface 101.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The low-k dielectric layer 100 may have a dielectric constant less than that of the base substrate BS. The dielectric constant of the base substrate BS may range, for example, about 3.5 to about 4.2. The dielectric constant of the low-k dielectric layer 100 may range, for example, about 1.2 to about 3.2. The low-k dielectric layer 100 may include or be formed of, for example, hydrogen silsesquioxane (HSQ), methyl silsesquioxane (MSSQ), xerogel, aerogel, benzocyclobutene (BCB), divinylsiloxane-bis-benzocyclobutene (DVS-BCB), perfluorocyclobutyl (PFCB), polyimide (PI), poly(arylene ether), polynaphthalene, tetraethylorthosilicate (TEOS), SiOF, black diamond, parylene, fluorinated amorphous carbon or a combination thereof.

The lower solder resist layer LS may cover/contact a bottom surface of the base substrate BS. The lower solder resist layer LS may cover/contact the second bottom surface 102 of the low-k dielectric layer 100. The lower solder resist layer LS may have a top surface LS_T and a bottom surface LS_B. The first bottom surface 101 of the low-k dielectric layer 100 may be disposed lower than the top surface LS_T of the lower solder resist layer LS. The first bottom surface 101 of the low-k dielectric layer 100 may be located at a level lower than that of the top surface LS_T of the lower solder resist layer LS. The lower conductive structures 130 may be disposed between the top and bottom surface LS_T and LS_B of the lower solder resist layer LS. For example, a top surface of a lower conductive structure 130 may be disposed at a level lower than the top surface LS_T of the lower solder resister layer LS, and a bottom surface of the lower conductive structure 130 may be disposed at a level higher than the bottom surface LS_B of the lower solder resister layer LS.

The lower solder resist layer LS may include or be formed of a polymeric material. For example, the lower solder resist layer LS may include or be formed of at least one selected from epoxy and acrylate.

The upper solder resist layer US may cover/contact a top surface of the base substrate BS. The upper solder resist layer US may cover/contact a top surface of the low-k dielectric layer 100. In some embodiments, the low-k dielectric layer 100 may penetrate the upper solder resist layer US, e.g., in a vertical direction.

The upper solder resist layer US may include or be formed of a polymeric material. For example, the upper solder resist layer US may include or be formed of at least one selected from epoxy and acrylate.

The connection conductive structure 120 may be electrically connected to and/or contact the bump BP. The semiconductor chip 200 may be electrically connected through the bump BP to the connection conductive structure 120. The connection conductive structure 120 may be provided in the low-k dielectric layer 100. For example, the connection conductive structure 120 may be surrounded by the low-k dielectric layer 100. For example, side surfaces of the connection conductive structure 120 may be in contact with the low-k dielectric layer 100, and the uppermost surface of the connection conductive structure 120 may be at the same level as or at a lower level than a top surface of the low-k dielectric layer 100 and the lowermost surface of the connection conductive structure 120 may be at the same level as or at a higher level than a bottom surface of the low-k dielectric layer 100. In some embodiments, the connection conductive structure 120 may penetrate the low-k dielectric layer 100. The connection conductive structure 120 may extend in the third direction D3.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component.

The connection conductive structure 120 may include a connection conductive pad 121 electrically connected to and/or contact the bump BP and a connection conductive via 122 connected to the connection conductive pad 121. The connection conductive via 122 and the connection conductive pad 121 may include or be formed of a conductive material. For example, the connection conductive via 122 and the connection conductive pad 121 may include or be formed of copper.

The connection conductive via 122 may extend along the third direction D3. An entirety of the connection conductive via 122 may overlap the bump BP, e.g., in the vertical direction. A bottom surface 123 of the connection conductive via 122 may be in contact with a top surface 133 of the lower conductive structure 130. The bottom surface 123 of the connection conductive via 122 may be a bottom surface 123 of the connection conductive structure 120. The connection conductive via 122 may have a width, e.g., in a horizontal direction, less than that of the connection conductive pad 121, e.g., in the horizontal direction.

The lower conductive structure 130 may be electrically connected to the connection conductive structure 120 and the solder ball 110. The lower conductive structure 130 may be in contact with the solder ball 110 and the connection conductive structure 120. The lower conductive structure 130 may be provided in the lower solder resist layer LS. In some embodiments, a portion of the lower conductive structure 130 may overlap the low-k dielectric layer 100, e.g., in the vertical direction. In some embodiments, the lower conductive structure 130 may be surrounded by the lower solder resist layer LS and the low-k dielectric layer 100. For example, side surfaces of the lower conductive structure 130 may contact the lower solder resist layer LS and the low-k dielectric layer 100. The top surface 133 of the lower conductive structure 130 may be in contact with the first bottom surface 101 of the low-k dielectric layer 100. The lower solder resist layer LS may protect the lower conductive structure 130. The lower conductive structure 130 may have a bottom surface 134 coplanar with the second bottom surface 102 of the low-k dielectric layer 100. The bottom surface 134 of the lower conductive structure 130 may be connected to the second bottom surface 102 of the low-k dielectric layer 100. The lower conductive structure 130 may be located at a level lower than that of the base substrate BS.

In some embodiments, the lower conductive structure 130 and the connection conductive structure 120 may be electrically connected to each other in the low-k dielectric layer 100. In some embodiments, the lower conductive structure 130 and the connection conductive structure 120 may be in contact with each other in the low-k dielectric layer 100. For example, a contact point between the lower conductive structure 130 and the connection conductive structure 120 may be at a level lower than the top surface of the low-k dielectric layer 100 and higher than the second bottom surface 102 of the low-k dielectric layer 100. For example, the contact point between the lower conductive structure 130 and the connection conductive structure 120 may be at the same level as the first bottom surface 101 of the low-k dielectric layer 100. The lower conductive structure 130 may extend in the first direction D1. In some embodiments, the lower conductive structures 130 may have the same length. In some embodiments, the lower conductive structures 130 may have different lengths.

The lower conductive structure 130 may include a lower conductive pad 131 electrically connected to and/or contact the solder ball 110 and a lower conductive line 132 electrically connected to and/or contact the lower conductive pad 131. The lower conductive line 132 may be electrically connected to and/or contact the connection conductive via 122 of the connection conductive structure 120. The lower conductive line 132 may extend in the first direction D1 from a contact point/surface between the lower conductive pad 131 and the lower conductive line 132. The lower conductive pad 131 and the lower conductive line 132 may include or be formed of a conductive material. For example, the lower conductive pad 131 and the lower conductive line 132 may include or be formed of copper.

The solder ball 110 may penetrate the lower solder resist layer LS to come into contact with the lower conductive pad 131 of the lower conductive structure 130. The solder ball 110 may include or be formed of a conductive material.

A lowermost one of the semiconductor chips 200 may be electrically connected through the adhesion layer AD to the printed circuit board PCB. The semiconductor chips 200 may be stacked along the third direction D3 on the printed circuit board PCB. The semiconductor chips 200 may be provided in the molding layer MD. For example, side surfaces of the semiconductor chips 200 may contact the molding layer MD. The semiconductor chip 200 may include a first wiring structure 201, a substrate 202, a through via 203, and a second wiring structure 204.

The first wiring structure 201 may cover/contact a bottom surface of the substrate 202. For example, the first wiring structure 201 may be formed on the bottom surface of the substrate 202. The first wiring structure 201 may include dielectric layers and conductive structures disposed in/on the dielectric layers. The conductive structure of the first wiring structure 201 may be electrically connected to the through via 203. The conductive structure of the first wiring structure 201 may be, for example, a conductive contact, a conductive line, or a conductive pad.

The second wiring structure 204 may cover/contact a top surface of the substrate 202. For example, the second wiring structure 204 may be formed on the bottom surface of the substrate 202. The second wiring structure 204 may include dielectric layers and conductive structures disposed in/on the dielectric layers. The conductive structure of the second wiring structure 204 may be electrically connected to the through via 203. The conductive structure of the second wiring structure 204 may be, for example, a conductive contact, a conductive line, or a conductive pad.

The through via 203 may be electrically connected to and/or contact the first wiring structure 201 and the second wiring structure 204. The through via 203 may include or be formed of a conductive material. For example, the through via 203 may include or be formed of copper.

The substrate 202 may be disposed between the first wiring structure 201 and the second wiring structure 204. In some embodiments, the substrate 202 may be a semiconductor substrate. For example, the substrate 202 may be a silicon substrate.

A distance between the first wiring structure 201 of the lowermost semiconductor chip 200 and the lower conductive structure 130 of the printed circuit board PCB may be greater than a width (e.g., in a vertical direction or thickness) of the printed circuit board PCB. For example, a distance L1 in the third direction D3 between the first wiring structure 201 of the lowermost semiconductor chip 200 and the lower conductive structure 130 of the printed circuit board PCB may be greater than a width (or thickness) W1 in the third direction D3 of the printed circuit board PCB.

The bump BP may be disposed between the lowermost semiconductor chip 200 and the printed circuit board PCB or between the semiconductor chips 200. The bump BP between the semiconductor chip 200 and the printed circuit board PCB may electrically connect the semiconductor chip 200 to the printed circuit board PCB. The bump BP may electrically connect the first wiring structure 201 of the semiconductor chip 200 to the connection conductive structure 120 of the printed circuit board PCB. The bump BP may be surrounded by the adhesion layer AD. For example, side surfaces of the bump BP may contact the adhesion layer AD. The bump BP may include or be formed of a conductive material. For example, the bump BP may include or be formed of copper.

The adhesion layer AD may be disposed between the lowermost semiconductor chip 200 and the printed circuit board PCB or between the semiconductor chips 200. The adhesion layer AD may include or be formed of a polymeric material.

The molding layer MD may be provided on the printed circuit board PCB. For example, a bottom surface of the molding layer MD may contact a top surface of the printed circuit board PCB. The molding layer MD may include or be formed of a polymeric material.

For the semiconductor package according to some embodiments, the connection conductive structure 120 electrically connected to and/or contact the bump BP may vertically penetrate the low-k dielectric layer 100 while vertically overlapping the bump BP, and thus a relatively large distance may be provided between the lower conductive structure 130 and the first wiring structure 201 of the lowermost semiconductor chip 200. Therefore, there may be a reduction in package capacitance based on a distance between the lower conductive structure 130 and the first wiring structure 201 of the lowermost semiconductor chip 200, and there may also be an improvement in high-speed operating characteristics of the semiconductor package.

FIGS. 2A, 2B, 2C, and 2D illustrate cross-sectional views showing a method of fabricating the semiconductor package depicted in FIGS. 1A and 1B.

Figure 2A:
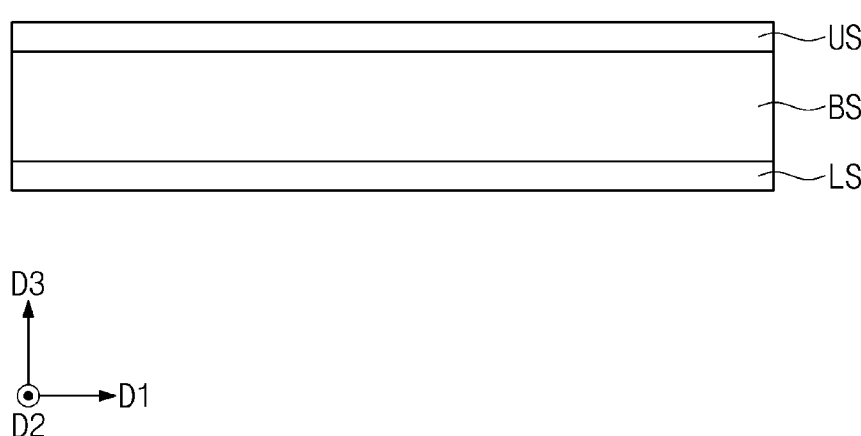
FIGS. 2A, 2B, 2C, and 2D illustrate cross-sectional views showing a method of fabricating the semiconductor package according to embodiments illustrated in FIGS. 1A and 1B.

Referring to FIG. 2A, an upper solder resist layer US may be formed to cover/contact a top surface of a base substrate BS, and a lower solder resist layer LS may be formed to cover/contact a bottom surface of the base substrate BS.

Figure 2B:
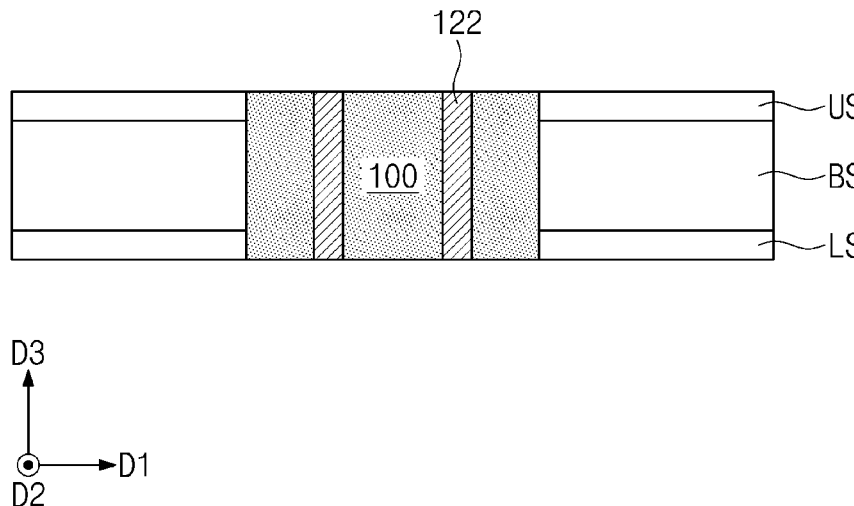

Referring to FIG. 2B, there may be formed a low-k dielectric layer 100 and connection conductive vias 122. The formation of the low-k dielectric layer 100 and the connection conductive vias 122 may include forming the connection conductive vias 122 in the low-k dielectric layer 100, forming an opening that penetrates the upper solder resist layer US, the base substrate BS, and the lower solder resist layer LS, and placing the low-k dielectric layer 100 in the opening.

In some embodiments, the connection conductive via 122 and the low-k dielectric layer 100 may penetrate the upper solder resist layer US, the base substrate BS, and the lower solder resist layer LS. The connection conductive via 122 may be surrounded by the low-k dielectric layer 100. For example, the whole side surfaces of the conductive via 122 may contact the low-k dielectric layer 100.

Figure 2C:
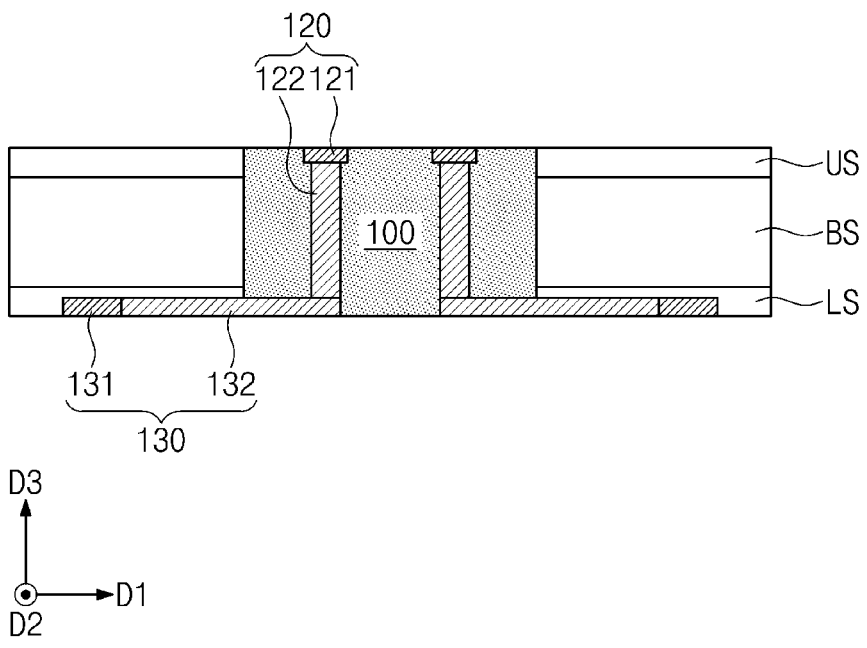

Referring to FIG. 2C, connection conductive pads 121 may be formed in the low-k dielectric layer 100. The formation of the connection conductive pad 121 may include removing an upper portion of the low-k dielectric layer 100 and an upper portion of the connection conductive via 122, and forming the connection conductive pad 121 in an empty space from which the upper portion of the low-k dielectric layer 100 and the upper portion of the connection conductive via 122 are removed.

The connection conductive via 122 may be electrically connected to and/or contact the connection conductive pad 121. The formation of the connection conductive pad 121 may define a connection conductive structure 120 including the connection conductive pad 121 and the connection conductive via 122. For example, the connection conductive structure 120 may be formed of the connection conductive pad 121 and the connection conductive via 122.

A lower conductive structure 130 may be formed. The formation of the lower conductive structure 130 may include removing a lower portion of the low-k dielectric layer 100, a lower portion of the connection conductive via 122, and a lower portion of the lower solder resist layer LS, and forming the lower conductive structure 130 in an empty space from which the lower portion of the low-k dielectric layer 100, the lower portion of the connection conductive via 122, and the lower portion of the lower solder resist layer LS are removed. The lower conductive structure 130 may include or be formed of a lower conductive pad 131 and a lower conductive line 132. The lower conductive pad 131 may be formed in the lower solder resist layer LS. The lower conductive line 132 may be formed to contact the lower conductive pad 131.

Figure 2D:
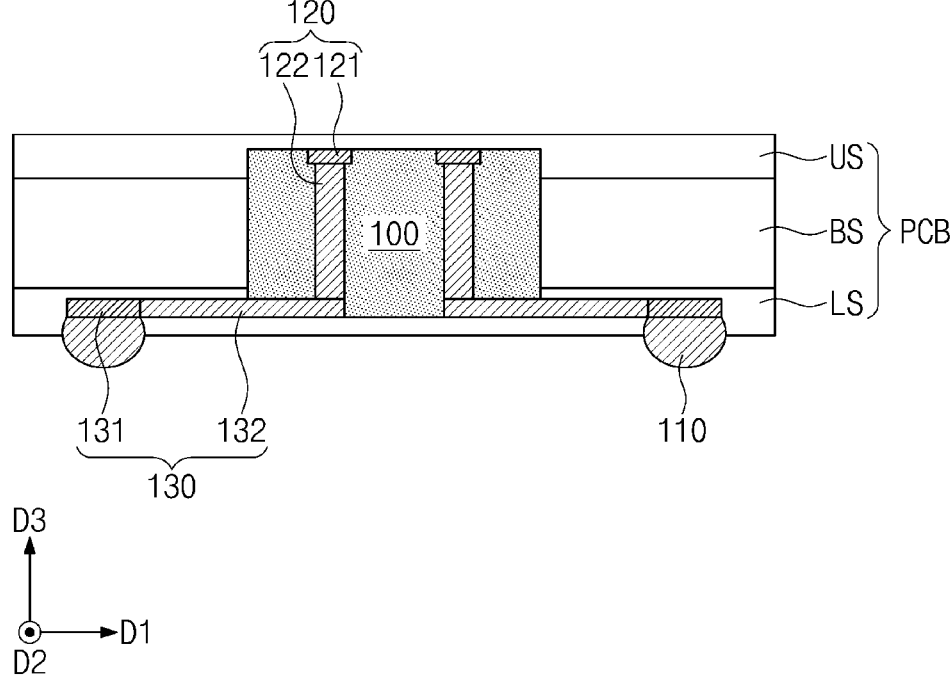

Referring to FIG. 2D, the upper solder resist layer US may become to have an increased thickness. The increase in thickness of the upper solder resist layer US may allow the upper solder resist layer US to cover the low-k dielectric layer 100 and the connection conductive pad 121. For example, the upper solder resist layer US may cover/contact top surfaces of the low-k dielectric layer 100 and the connection conductive pad 121.

The lower solder resist layer LS may become to have an increased thickness. The increase in thickness of the lower solder resist layer LS may allow the lower solder resist layer LS to cover the lower connection structure 130 and the low-k dielectric layer 100. For example, the lower solder resist layer LS may cover/contact bottom surfaces of the low-k dielectric layer 100 and the lower connection structure 130.

The process to increase the thicknesses of the upper and lower solder resist layers US and LS may be completed to form a printed circuit board PCB. For example, the process to increase the thicknesses of the upper and lower solder resist layers US and LS may be coating additional solder resister layer on the upper and lower solder resist layers US and LS.

A solder ball 110 may be formed. The solder ball 110 may be formed to be electrically connected to and/or contact the lower conductive pad 131. The formation of the solder ball 110 may include removing a lower portion of the lower solder resist layer LS to expose the lower conductive pad 131, and forming the solder ball 110 to contact the lower conductive pad 131.

Referring to FIG. 1A, semiconductor chips 200, bumps BP, and adhesion layers AD may be formed on the printed circuit board PCB. A molding layer MD may be formed to encapsulate the semiconductor chips 200. For example, the molding layer MD may surround and contact side surfaces of the semiconductor chips 200.

Figure 3:
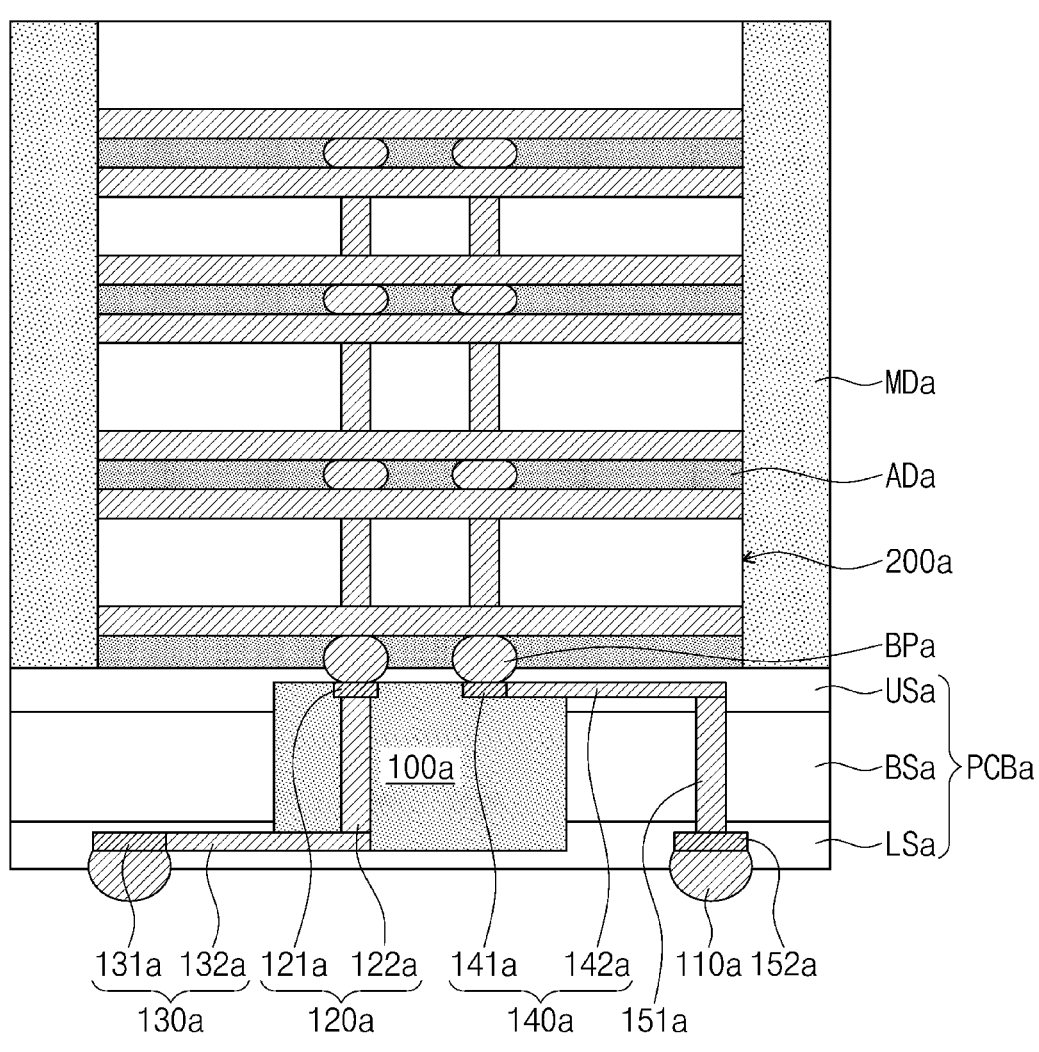
FIG. 3 illustrates a cross-sectional view showing a semiconductor package according to some embodiments.
Figure 3:
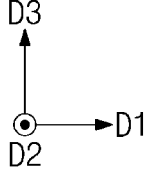

FIG. 3 illustrates a cross-sectional view showing a semiconductor package according to some embodiments.

Referring to FIG. 3, a semiconductor package may include solder balls 110a, a printed circuit board PCBa, semiconductor chips 200a, bumps BPa, adhesion layers ADa, and a molding layer MDa.

The printed circuit board PCBa may include a base substrate BSa, a low-k dielectric layer 100a, an upper solder resist layer USa, a lower solder resist layer LSa, a connection conductive structure 120a, a lower conductive structure 130a, an upper conductive structure 140a, a solder overlap via 151a, and a solder overlap pad 152a.

The upper conductive structure 140a may be provided in the upper solder resist layer USa. The upper conductive structure 140a may be provided between top and bottom surfaces of the upper solder resist layer USa. The upper conductive structure 140a may be surrounded by the upper solder resist layer USa. For example, the upper solder resist layer USa may contact side surfaces of the upper conductive structure 140a. A portion of the upper conductive structure 140a may overlap the low-k dielectric layer 100a, e.g., in a vertical direction.

The upper conductive structure 140a may include an upper conductive pad 141a and an upper conductive line 142a. The upper conductive pad 141a may be electrically connected to and/or contact the bump BPa. The upper conductive line 142a may be electrically connected to and/or contact the upper conductive pad 141*a* and the solder overlap via 151*a*. The upper conductive pad 141*a* and the upper conductive line 142*a* may include or be formed of a conductive material. For example, the upper conductive pad 141*a* and the upper conductive line 142*a* may include or be formed of copper.

The solder overlap via 151*a* may extend in the third direction D3 to penetrate the base substrate BSa. For example, the solder overlap via 151*a* vertically penetrate the base substrate BSa. A top surface of the solder overlap via 151*a* may be in contact with a bottom surface of the upper conductive structure 140*a*. The top surface of the solder overlap via 151*a* may be disposed in the upper solder resist layer USa. For example, the top surface of the solder overlap via 151*a* may be at a level between top and bottom surfaces of the upper solder resist layer USa. The solder overlap via 151*a* may be electrically connected to the solder overlap pad 152*a*. A bottom surface of the solder overlap via 151*a* may be in contact with a top surface of the solder overlap pad 152*a*. The bottom surface of the solder overlap via 151*a* may be disposed in the lower solder resist layer LSa. For example, the bottom surface of the solder overlap via 151*a* may be at a level between top and bottom surfaces of the lower solder resist layer LSa. The solder overlap via 151*a* may include or be formed of a conductive material. For example, the solder overlap via 151*a* may include or be formed of copper.

The solder overlap pad 152*a* may be disposed in the lower solder resist layer LSa. For example, the lower solder resist layer LSa may contact side surfaces of the solder overlap pad 152*a*, a top surface of solder overlap pad 152*a* may be at a lower level than a top surface of the lower solder resist layer LSa, and a bottom surface of solder overlap pad 152*a* may be at a higher level than a bottom surface of the lower solder resist layer LSa. The solder overlap pad 152*a* may be electrically connected to and/or contact the solder ball 110*a*. The solder overlap pad 152*a* may include or be formed of a conductive material. For example, the solder overlap pad 152*a* may include or be formed of copper.

Relatively low-speed signals may be transmitted through the upper conductive structure 140*a*, the solder overlap via 151*a*, and the solder overlap pad 152*a*. For example, a low-frequency signal may be transmitted through the upper conductive structure 140*a*, the solder overlap via 151*a*, and the solder overlap pad 152*a*. For example, frequencies of signals transmitted through the upper conductive structure 140*a*, the solder overlap via 151*a*, and the solder overlap pad 152*a* may be lower than frequencies of signals transmitted through the connection conductive structure 120*a* and the lower conductive structure 130*a*. For example, the frequencies of signals transmitted through the upper conductive structure 140*a*, the solder overlap via 151*a*, and the solder overlap pad 152*a* may be at least ten times lower than frequencies of signals transmitted through the connection conductive structure 120*a* and the lower conductive structure 130*a*. As the semiconductor package includes the upper conductive structure 140*a*, the solder overlap via 151*a*, and the solder overlap pad 152*a* through which relatively low-speed signals are transmitted, the semiconductor package may increase in integration.

Figure 4:
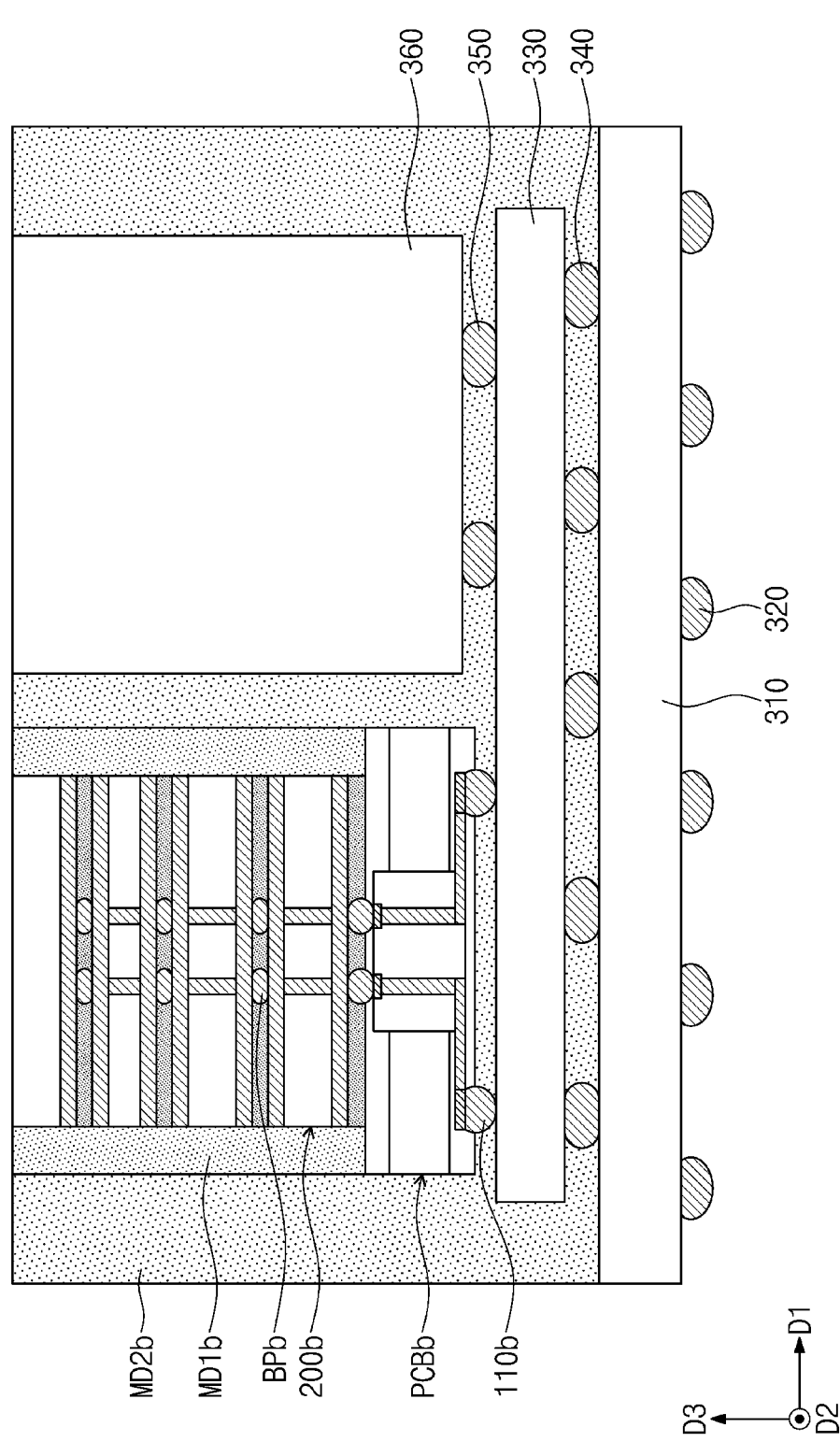
FIG. 4 illustrates a cross-sectional view showing a semiconductor package according to some embodiments.

FIG. 4 illustrates a cross-sectional view showing a semiconductor package according to some embodiments.

Referring to FIG. 4, a semiconductor package may include a package substrate 310. The package substrate 310 may be provided with first terminals 320 electrically connected thereto. The semiconductor package may be mounted through the first terminals 320 on an external apparatus (e.g., a main board).

An interposer 330 may be provided on the package substrate 310. Second terminals 340 may be provided to electrically connect the package substrate 310 and the interposer 330 to each other. The second terminals 340 may be provided between the package substrate 310 and the interposer 330.

A processor chip 360 may be provided on the interposer 330. For example, the processor chip 360 may be a graphic processing unit (GPU) or a central processing unit (CPU). Third terminals 350 may be provided to electrically connect the processor chip 360 and the interposer 330 to each other. The third terminals 350 may be provided between the processor chip 360 and the interposer 330.

The interposer 330 may be provided thereon with a printed circuit board PCBb and semiconductor chips 200*b*. The printed circuit board PCBb and the semiconductor chips 200*b* may be spaced apart in the first direction D1 from the processor chip 360. Solder balls 110*b* may be provided to electrically connect the printed circuit board PCBb to the interposer 330. The solder balls 110*b* may be provided between the printed circuit board PCBb and the interposer 330. A first molding layer MD1*b* may be provided to encapsulate the semiconductor chips 200*b*. For example, the first molding layer MD1*b* may contact side surfaces of the semiconductor chips 200*b*.

Bumps BPb may be provided. The bumps BPb may be provided between the semiconductor chips 200*b* and/or between a lowermost semiconductor chip 200*b* and the printed circuit board PCBb.

The printed circuit board PCBb may include a low-k dielectric layer, a connection conductive structure that penetrates the low-k dielectric layer, e.g., in a vertical direction, and a lower conductive structure that electrically connects the connection conductive structure to the solder ball 110*b*.

The package substrate 310 may be provided thereon with a second molding layer MD2*d* that encapsulate the interposer 330, the processor chip 360, the printed circuit board PCBb, and the semiconductor chips 200*b*. For example, the second molding layer MD2*d* may contact side surfaces of the interposer 330, the processor chip 360, the printed circuit board PCBb, and the first molding layer MD1*b*, and may be interposed between the package substrate 310 and the interposer 330, between the interposer 330 and the processor chip 360, and between the interposer 330 and the printed circuit board PCBb.

For a semiconductor package according to some embodiments of the present inventive concepts, a distance between a semiconductor chip and a lower conductive structure of a printed circuit board may be increased to reduce a package capacitance and to improve high-speed operating characteristics of the semiconductor package. Even though different figures show variations of exemplary embodiments and different embodiments disclose different features from each other, these figures and embodiments are not necessarily intended to be mutually exclusive from each other. Rather, certain features depicted in different figures and/or described above in different embodiments can be combined with other features from other figures/embodiments to result in additional variations of embodiments, when taking the figures and related descriptions of embodiments as a whole into consideration. For example, components and/or features of different embodiments described above can be interchangeably combined with components and/or features of other embodiments unless the context indicates otherwise.

Although the present invention has been described in connection with the some example embodiments of the present inventive concepts illustrated in the accompanying drawings, it will be understood by one of ordinary skill in the art that variations in form and detail may be made therein without departing from the spirit of the present inventive concepts. The above disclosed embodiments should thus be considered illustrative and not restrictive.

What is claimed is:

1. A semiconductor package, comprising:
a solder ball;
a printed circuit board on the solder ball;
a bump on the printed circuit board; and
a semiconductor chip on the bump,
wherein the printed circuit board includes:
a base substrate;
a low-k dielectric layer that penetrates the base substrate from an upper surface of the base substrate to a lower surface of the base substrate;
a connection conductive structure electrically connected to the bump and surrounded by the low-k dielectric layer; and
a lower conductive structure electrically connected to the solder ball and the connection conductive structure,
wherein a top surface of the lower conductive structure is in contact with a first bottom surface of the low-k dielectric layer.

2. The semiconductor package of claim 1, wherein a dielectric constant of the low-k dielectric layer is less than a dielectric constant of the base substrate.

3. The semiconductor package of claim 1, wherein
the printed circuit board further includes a lower solder resist layer that covers a bottom surface of the base substrate, and
the lower conductive structure is between top and bottom surfaces of the lower solder resist layer.

4. The semiconductor package of claim 1, wherein the connection conductive structure includes:
a connection conductive pad electrically connected to the bump; and
a connection conductive via electrically connected to the connection conductive pad.

5. The semiconductor package of claim 4, wherein an entirety of the connection conductive via vertically overlaps the bump.

6. The semiconductor package of claim 5, wherein a bottom surface of the connection conductive via is in contact with the top surface of the lower conductive structure.

7. The semiconductor package of claim 1, wherein
the low-k dielectric layer has a second bottom surface at a level lower than a level of the first bottom surface of the low-k dielectric layer, and
a bottom surface of the lower conductive structure is coplanar with the second bottom surface of the low-k dielectric layer.

8. The semiconductor package of claim 1, wherein the top surface of the lower conductive structure is in contact with a bottom surface of the connection conductive structure.

9. The semiconductor package of claim 1, wherein a dielectric constant of the low-k dielectric layer is in a range of about 1.2 to about 3.2.

10. A semiconductor package, comprising:
a solder ball;
a printed circuit board on the solder ball;
a bump on the printed circuit board; and
a semiconductor chip on the bump,
wherein the printed circuit board includes:

a low-k dielectric layer;
a base substrate that surrounds the low-k dielectric layer;
a connection conductive structure that is electrically connected to the bump and penetrates the low-k dielectric layer in a vertical direction; and
a lower conductive structure electrically connected to the solder ball and the connection conductive structure,
wherein the lower conductive structure is at a level lower than a level of the base substrate.

11. The semiconductor package of claim 10, wherein a dielectric constant of the low-k dielectric layer is less than a dielectric constant of the base substrate.

12. The semiconductor package of claim 11, wherein
the dielectric constant of the low-k dielectric layer is in a range of about 1.2 to about 3.2, and
the dielectric constant of the base substrate is in a range of about 3.5 to about 4.2.

13. The semiconductor package of claim 10, wherein the printed circuit board further includes:
an upper solder resist layer that covers a top surface of the base substrate; and
an upper conductive structure surrounded by the upper solder resist layer.

14. The semiconductor package of claim 13, wherein the printed circuit board further includes a solder overlap via electrically connected to the upper conductive structure,
wherein the solder overlap via penetrates the base substrate in the vertical direction.

15. The semiconductor package of claim 14, wherein the printed circuit board further includes:
a lower solder resist layer that covers a bottom surface of the base substrate; and
a solder overlap pad in the lower solder resist layer,
wherein the solder overlap pad is electrically connected to the solder overlap via.

16. The semiconductor package of claim 10, wherein
the connection conductive structure is one of a plurality of connection conductive structures included in the printed circuit board, and
the lower conductive structure is one of a plurality of lower conductive structures included in the printed circuit board.

17. The semiconductor package of claim 10, wherein the semiconductor chip includes a substrate and a first wiring structure that covers a bottom surface of the substrate,
wherein a distance between the first wiring structure and the lower conductive structure is greater than a thickness of the printed circuit board.

18. The semiconductor package of claim 10, wherein the printed circuit board further includes a lower solder resist layer that covers a bottom surface of the base substrate,
wherein the lower solder resist layer surrounds the lower conductive structure.

19. A semiconductor package, comprising:
a solder ball;
a printed circuit board on the solder ball;
a bump on the printed circuit board;
a semiconductor chip on the bump; and
an adhesion layer between the semiconductor chip and the printed circuit board,
wherein the printed circuit board includes:
a base substrate;
an upper solder resist layer that covers a top surface of the base substrate;
a lower solder resist layer that covers a bottom surface of the base substrate;
a low-k dielectric layer that penetrates the base substrate;

13

14 a connection conductive structure electrically connected to the bump and surrounded by the low-k dielectric layer; and a lower conductive structure electrically connected to the solder ball and the connection conductive structure, wherein a top surface of the lower conductive structure is in contact with a first bottom surface of the low-k dielectric layer and a bottom surface of the connection conductive structure, wherein the lower solder resist layer covers a second bottom surface of the low-k dielectric layer and a bottom surface of the lower conductive structure, and wherein the second bottom surface of the low-k dielectric layer is at a level lower than a level of the first bottom surface of the low-k dielectric layer.

* * * * *